United States Patent [19]
Sato

[11] Patent Number: 5,477,058
[45] Date of Patent: Dec. 19, 1995

[54] ATTENUATED PHASE-SHIFTING MASK WITH OPAQUE RETICLE ALIGNMENT MARKS

[75] Inventor: Takashi Sato, Fishkill, N.Y.

[73] Assignee: Kabushiki Kaisha Toshiba, Japan

[21] Appl. No.: 337,536

[22] Filed: Nov. 9, 1994

[51] Int. Cl.$^6$ .................................................. G01N 21/86
[52] U.S. Cl. ............................ 250/548; 356/401; 430/5
[58] Field of Search .................................... 250/548, 561, 250/571, 491.1, 492.2; 356/401, 400, 399; 355/125, 53, 43; 430/5, 311–314

[56] References Cited

U.S. PATENT DOCUMENTS

| | | | |
|---|---|---|---|
| 4,269,505 | 5/1981 | Mayer | 355/62 |
| 4,606,643 | 8/1986 | Tam | 356/401 |
| 4,755,053 | 7/1988 | Levinson et al. | 356/400 |
| 4,902,899 | 2/1990 | Lin et al. | 250/492.1 |
| 5,194,744 | 3/1993 | Aoki et al. | 250/548 |
| 5,216,257 | 6/1993 | Brueck et al. | 356/401 |
| 5,237,393 | 8/1993 | Tominaga | 356/401 |
| 5,268,244 | 12/1993 | Yoo | 430/5 |

OTHER PUBLICATIONS

A. P. Ghosh and D. B. Dove, Direct Phase Measurements In Phase Shifting Masks, SPIE vol. 1673 Integrated Circuit Metrology, Inspection and Process Control VI, pp. 242–254, Jan. 1992.

A. Callegari et al., Optical properties of hydrogenated amorphous–carbon film for attenuated phase–shift mask applications, J. Vac. Sci. Technol B 11(6), pp. 2697–2699 (Nov./Dec. 1993).

C. Pierrat, J. De Marco, Phase–Shifting Mask Fabrication, SPIE vol. 2087 Photomask Technology and Management, pp. 362–371, Jan. 1993.

Wen–an Loong et al., Simulation and fabrication of a new phase shifting mask for 0.35 μm contact hole pattern transfer: Halftone–rim, SPIE vol. 2087 Photomask Technology and Management, pp. 380–389, Jan. 1993.

Burn J. Lin. The Attenuated Phase–Shifting Mask. Solid State Technology, pp. 43–47 (Jan/1992).

M. A. McCord et al., Effect of mask absorber thickness on x–ray exposure latitude and resolution, J. Vac. Sci. Technol. B 11(6), pp. 2881–2887 (Nov./Dec. 1993).

R. L. Kostelak et al., Printing of phase–shifting defects, J. Vac. Sci. Technol. B 11 (6), pp. 2705–2713 (Nov/Dec 1993).

B. J. Lin., The optimum numerical aperture for attenuated phase–shifting masks, Microelectronic Engineering 17, pp. 79–86, Jan. 1992.

Primary Examiner—Edward P. Westin
Assistant Examiner—Que T. Le
Attorney, Agent, or Firm—Banner & Allegretti, Ltd.

[57] ABSTRACT

An attenuated phase-shifting mask has a circuit pattern formed of a layer of halftone phase-shifting material, e.g., SiNx, which inherently appears substantially transparent to the visible light utilized to align the mask with a wafer. The reticle alignment marks of the mask are made of a separate substantially opaque layer in order to ensure that the reticle alignment marks will be visible to the mask/wafer alignment equipment.

16 Claims, 2 Drawing Sheets

ATTENUATED PHASE-SHIFTING MASK WITH OPAQUE RETICLE ALIGNMENT MARKS

BACKGROUND OF THE INVENTION

The present invention relates to photolithographic masks used in the production of integrated circuits. More specifically, the present invention relates to the production of attenuated phase-shift masks used for LSI and VLSI manufacturing, and in particular to the reticle alignment marks placed thereon.

Phase-shifting masks (PSM's) are distinguished from conventional photolithographic masks by the employment of selectively placed mask pattern materials allowing the transmission of exposure light with a phase-shift of π (180°). First pioneered in the early 1980's, this technique holds great promise for extending the limits of conventional photolithography to the production of circuit features as small as 0.25 µm, and perhaps smaller. The 180° phase difference created at the mask pattern edges sets up an interference effect that significantly enhances edge contrast, resulting in higher resolution and greater depth of field as compared to the conventional binary intensity masks utilizing only an opaque mask pattern material. Advantageously, the technique can be employed utilizing conventional photolithographic stepper optics and resist techniques.

Numerous PSM techniques have been developed. These include alternating, subresolution, rim, and attenuated phase-shifting techniques. Of these, the attenuated and rim phase-shifting techniques are the most versatile since they can be applied to any arbitrary mask pattern. As reported in Lin, Burn J., The Attenuated Phase-Shining Mask, SOLID STATE TECHNOLOGY, January 1992, attenuated phase-shifting masks have notable advantages over rim phase-shifting masks. For example, they can provide greater depth of focus, require shorter exposures, and use less mask area. Moreover, as explained below, an attenuated phase-shifting mask pattern can be formed from a single layer of material deposited on a substrate.

In the rim phase-shifting technique, an opaque layer of material is used to define the circuit features and a separate transmissive shifter layer is positioned about the edges of the features. In attenuated phase-shifting masks, a single slightly transmissive (halftone) absorber providing a phase-shift of 180° can take the place of the conventional opaque, e.g., chrome, layer of mask pattern material. Prior art FIG. 4 provides a visual comparison of the cross-section, electric field amplitude, and image intensity for the conventional binary intensity mask (BIM), the attenuated phase-shifting mask (APSM), and the rim phase-shifting mask (Rim PSM).

In addition to the pattern used to form circuit features on a wafer, a photolithographic mask used for circuit production will include in its kerf (the periphery of the mask outside of the pattern area) reticle alignment marks used to precisely align the mask with respect to the wafer in the exposure tool, e.g., the scanner or stepper. Such marks will take various forms depending on the equipment being used, but typically will comprise hatch marks or geometric shapes arranged in various locations, orientations and patterns (e.g., chevrons, squares, circles and X-shapes). The marks may also be in the form of diffraction gratings. See, e.g., Aoki et at. U.S. Pat. No. 5,194,744 (hereby incorporated by reference in its entirety).

Precision stage metrology systems are used to perform the alignment of the wafer and mask. Such systems employ various optical detecting devices to precisely determine the position of the marks relative to a predetermined reference location or a determined position of marks placed on the wafer. Typically, laser or other visible light is used to illuminate the marks, and photodetectors sense the position of the marks from light reflected, absorbed or scattered by the marks. For example, using a Nikon step and repeat stepper, an Hg lamp is used to illuminate the marks and photodectectors sense the position of the marks from light reflected by the marks. Using an SVGL (formerly Perkin Elmer) Micrascan scanning apparatus, an Argon laser (488 or 514 nm) is used to illuminate the marks from one side of the reticle and a photodector positioned on the opposite side of the reticle detects the position of the marks from light absorbed by the marks.

Heretofore, attenuated phase-shifting masks utilizing a halftone material to form the mask pattern (in lieu of the conventional opaque mask material) have included reticle alignment marks also formed of the halftone material. This stems from the conventional practice of forming the mask circuit pattern and reticle alignment marks simultaneously in the same process steps (e.g., layer deposition, exposure and etching). The composition and thickness of the halftone layer will vary depending on the wavelength of the electromagnetic radiation, e.g., light, utilized in the wafer exposure step. In particular, since halftone materials exhibit different levels of light transmittance and phase-shift with respect to different wavelengths of light, the halftone layer composition and thickness must be varied for a given exposure wavelength in order to achieve the desired 180° phase-shift and a suitable attenuation level (e.g., providing a transmittance of between 2–10%). As explained hereinbelow, applicant recognized that adjustment of the halftone layer to optimize phase-shift and attenuation for certain wavelengths of exposure light can lead to difficulties in achieving accurate and reliable mask/wafer alignment.

SUMMARY OF THE INVENTION

It is a principal object of the present invention to provide an attenuated phase-shifting mask having reticle alignment marks that can be reliably detected, regardless of the halftone material utilized to form the mask pattern.

It is a more specific object of the present invention to provide an attenuated phase-shift mask as aforesaid, for use with exposure light in the deep UV range, and wherein visible light is used to detect the reticle alignment marks and thereby align the mask and wafer in the exposure tool.

It is a further object of the present invention to provide a method of using an attenuated phase-shift mask of the type described above in the production of an integrated circuit chip.

These and other objects are achieved by the present invention which, in one aspect, is embodied in an attenuated phase-shifting mask for use in the production of an integrated circuit chip. The mask comprises a light transmissive substrate and a mask pattern formed on the substrate. The mask pattern (a) defines a circuit pattern to be projected onto an integrated circuit chip, (b) includes a first layer of material that attenuates electromagnetic radiation passing therethrough, and which appears substantially transparent to visible light, and (c) serves to effect a phase-shift to electromagnetic radiation transmitted therethrough. At least one reticle alignment mark is formed on the substrate. The alignment mark is formed of a second layer of material that is substantially opaque to visible light.

In a second aspect, the invention is embodied in a method of projecting a circuit pattern onto a semi-conductor wafer, comprising aligning in an exposure tool an attenuated phase-shift mask and a semi-conductor wafer. The alignment step is performed by detecting with an alignment light a reticle alignment mark on the mask. The mark is formed of a first layer of material that is substantially opaque to the alignment light. After the alignment, electromagnetic radiation passed through a mask pattern formed on the mask is projected onto the semiconductor wafer. The mask pattern (a) defines a circuit pattern to be projected onto the wafer, (b) includes a second layer of material that attenuates the electromagnetic radiation passed therethrough, and which appears substantially transparent to the alignment light, and (c) serves to effect a phase-shift to said electromagnetic radiation passed therethrough.

These and other objects, features and advantages of the present invention will be readily apparent and fully understood from the following detailed description of the preferred embodiments, taken in connection with the appended drawings.

DETAILED DESCRIPTION OF THE PREFERRED EMBODIMENTS

Figure 1:
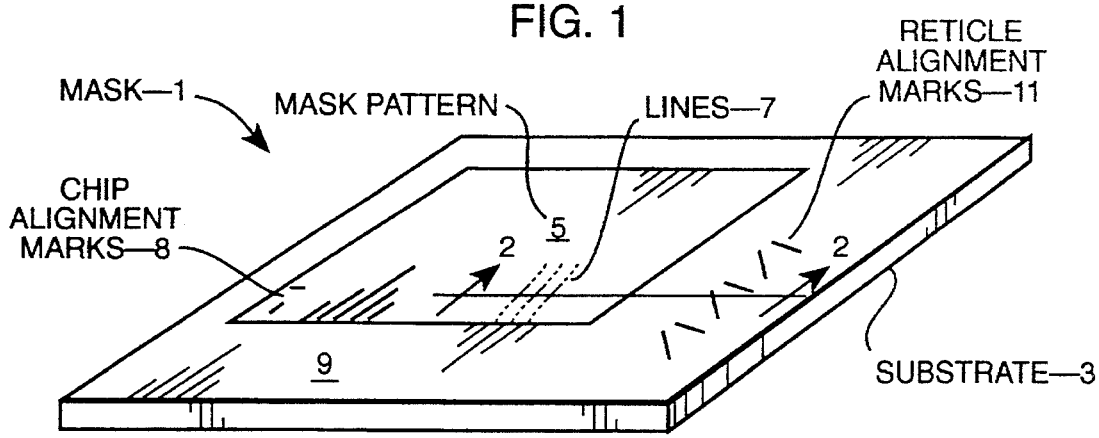
FIG. 1 is a diagrammatic perspective view of an attenuated phase-shift mask having reticle alignment marks in accordance with the present invention.

FIG. 1 illustrates an attenuated phase-shifting mask 1 in accordance with the present invention. Mask 1 comprises a light transmissive substrate 3, e.g., of quartz (fused silica). In a central region of substrate 3 is formed a mask pattern 5 comprising circuit features (e.g., line-space pairs, isolated line openings, isolated spaces, holes and islands) to be projected onto an integrated circuit chip or wafer (not shown). Such circuit features are diagrammatically represented by three adjacent parallel spaced lines 7. Mask pattern 5 will typically also comprise one or more chip alignment marks 8 used to align the chip following the initial exposure. The peripheral area surrounding mask pattern 5 constitutes the kerf 9. Formed on the substrate 3 in the kerf area 9 are a plurality of reticle alignment marks 11 used to precisely align the mask with the chip in the exposure tool, e.g., an SVGL Micrascan scanner, or a Nikon Step and Repeat stepper. Marks 11 are shown as pairs of hatch marks arranged in chevron shapes. Those skilled in the art will readily appreciate that these marks may take on a variety of shapes and configurations depending on the exposure/alignment equipment being used. See the Background section hereinabove.

Figure 2:
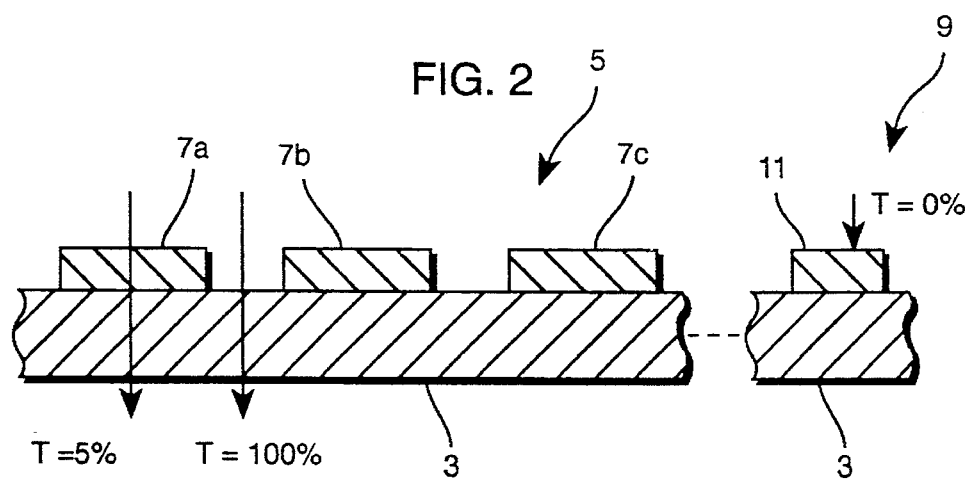
FIG. 2 is a cross-sectional view taken on line A—A in FIG. 1, wherein a single layer phase-shifting and light attenuating material is used for the mask pattern.

Mask pattern 5 is formed of a deposited layer of light attenuating and phase shifting material. In particular, referring to FIG. 2, in a preferred embodiment of the invention, mask pattern 5 (including lines 7a–c) is formed of a single layer of material performing the dual function of attenuating and phase shifting the light (or other electromagnetic radiation) transmitted therethrough. Generally, the desired phase shift will be 180°. Attenuation should be such as to provide a transmittance of 2–10%, with 5% being preferred for most applications.

Originally, halftone materials were formed of two layers: a transmittance controlling layer and a phase controlling layer. More recently, advantages have been realized through the use of single layer materials developed to perform the dual function of controlling light transmittance and phase-shift. As reported in Ito et al., Optimization of Optical Properties for Single-layer Halftone Masks, SPIE Vol. 2197, p.99, January 1994 (hereby incorporated by reference in its entirety), one such material comprises SiNx deposited by DC sputtering using a silicone target in a mixed atmosphere of argon and nitrogen gases. In that method, the composition ratio is controlled by changing the amount of flowing nitrogen. A number of other suitable single layer phase-shifting halftone materials have been developed. For example, plasma deposited hydrogenated amorphous-carbon films tuned to provide the proper attenuation and phase shift for light in the ultraviolet (UV) and deep UV ranges are reported in Callegari et al., Properties of Hydrogenated Amorphous-carbon Film for Attenuated Phase-shift Mask Applications, J. Vac. Sci. Technol. B 11 (6), p. 2697, November/December 1993 (hereby incorporated by reference in its entirety). As mentioned in the Ito et al. article, other single layer halftone phase-shifting materials that have been reported are $SiO_2$+CrO mixtures, MoSiO, and MoSiON.

Applicant recognized that a problem can arise when the reticle alignment marks are made from the halftone layer used to form the circuit pattern. Namely, marks made from layers configured to optimize the phase-shift and attenuation of exposure light sometimes cannot be properly detected by the alignment equipment. Applicant recognized that the problem stems from the substantially transparency of certain halftone materials and layer configurations with respect to the visible light used to detect the marks. Applicant found that the problem is most pronounced for halftone layers (particularly SiNx layers) optimized for use with exposure light in the deep UV range. For example, the present applicant recognized that SiNx layers which are optimized (e.g., in terms of composition and thickness) for use with an exposure light in the deep UV range (193 nm–365 nm) tend to be transparent to the visible light (approximately 430 nm–690 nm) generally used for the detection of the reticle alignment marks on the mask. Under these circumstances, proper mask to wafer alignment cannot be reliably achieved. The present invention avoids this problem.

In accordance with the present invention, reticle alignment marks 11 are made of a layer of material which is substantially opaque to visible light, e.g., a layer of Cr which is thick enough to prevent visible light from passing therethrough (T=0%). This ensures that the reticle alignment marks will be detectable by the alignment equipment when halftone materials appearing substantially transparent to visible light (such as SiNx) are used to form the circuit pattern on the mask. Accordingly, alignment of the mask and semi-conductor wafer for projecting a circuit pattern onto the wafer (e.g., using a Micrascan scanner or a Nikon Step and Repeat stepper, as described in the background section) can be reliably achieved by a simple modification of the manufacturing process.

Figure 3:
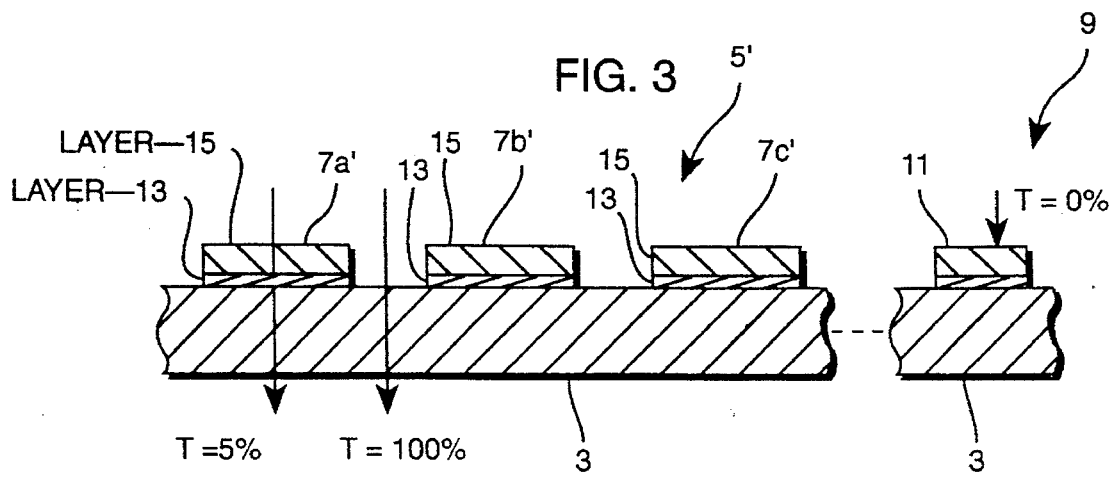
FIG. 3 is a cross-sectional view taken on line A—A in FIG. 1 illustrating an alternative embodiment of the invention employing separate layers of light attenuating and phase-shifting materials for the mask pattern.
Figure 4:
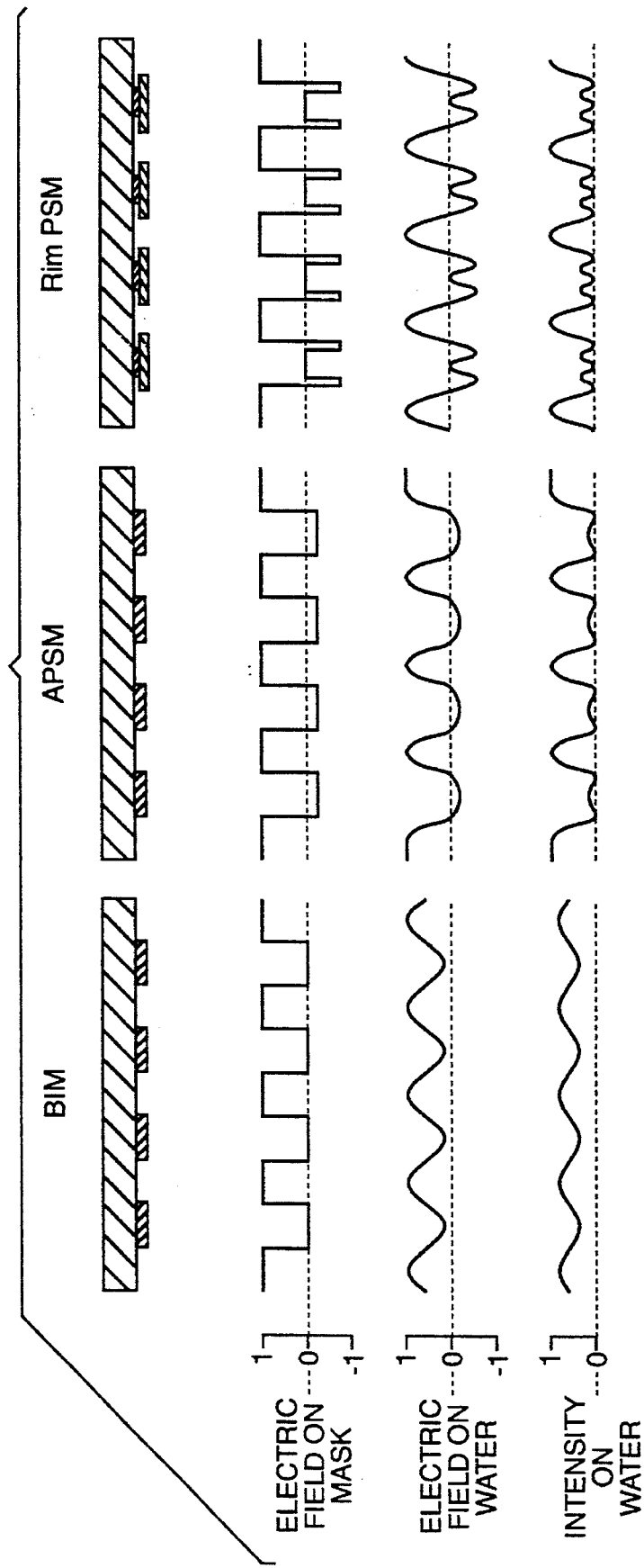
FIG. 4 is an explanatory table providing a visual comparison of the structure and characteristics of a conventional binary intensity mask, a rim phase-shifting mask and an attenuated phase-shifting mask.

An alternative embodiment is illustrated in FIG. 3. Instead of forming the mask pattern 5 using a single phase-shifting and attenuating layer, mask pattern 5' (including lines 7a–c') is formed by separate layers 13, 15 of phase-shifting and light attenuating materials. As reported in Ghosh et al., Direct Phase Measurements in Phase Shift Masks, SPIE INTEGRATED CIRCUIT METROLOGY, INSPECTION, AND PROCESS CONTROL VI, Vol. 1673, p. 242 (1992) (hereby incorporated by reference in its entirety), the separate layers may comprise a very thin layer 13 of Cr serving to attenuate transmittance to about 5% and introducing a partial phase shift, and a layer 15 of $SiO_2$ superimposed on layer 13, serving to adjust the phase shift to 180°.

The present invention has been described in terms of preferred embodiments thereof. Numerous other embodiments and variations within the scope and spirit of the invention as defined in the appended claims will occur to those of ordinary skill in the art upon reviewing this disclosure.

I claim:

1. An attenuated phase-shifting mask for use in the production of an integrated circuit chip, said mask comprising:

a light transmissive substrate;

a mask pattern formed on said substrate, said mask pattern (a) defining a circuit pattern to be projected onto an integrated circuit chip, (b) including a first layer of material that attenuates electromagnetic radiation passing therethrough, and which appears substantially transparent to visible light, and (c) serving to effect a phase-shift to electromagnetic radiation transmitted therethrough; and at least one reticle alignment mark formed on said substrate, said alignment mark being formed of a second layer of material that is substantially opaque to visible light.

2. An attenuated phase-shifting mask according to claim 1, wherein the mask pattern consists of a single layer of phase-shifting and attenuating material.

3. An attenuated phase-shifting mask according to claim 1, wherein the mask pattern comprises a plurality of layers of material serving to phase-shift and attenuate electromagnetic radiation passed therethrough.

4. An attenuated phase-shifting mask according to claim 2, wherein said layer of phase-shifting and light attenuating material comprises a layer of SiNx.

5. An attenuated phase-shifting mask according to claim 4, wherein said layer of phase-shifting and light attenuating material consists essentially of SiNx.

6. An attenuated phase-shifting mask according to claim 1, wherein said layer of phase-shifting and light attenuating material effects a 180° phase-shift to light in the deep UV range, and exhibits a transmittance of deep UV light between 2% and 10%.

7. An attenuated phase-shifting mask according to claim 1, wherein said mask pattern further defines chip alignment marks to be projected onto the chip.

8. An attenuated phase-shifting mask according to claim 2, wherein said reticle alignment mark comprises an opaque layer of Cr.

9. A method of projecting a circuit pattern onto a semiconductor wafer, comprising:

aligning in an exposure tool an attenuated phase-shift mask and a semi-conductor wafer, said alignment step being performed by detecting with an alignment light a reticle alignment mark on the mask formed of a first layer of material that is substantially opaque to the alignment light; then projecting onto the semiconductor wafer electromagnetic radiation passed through a mask pattern formed on said mask, said mask pattern (a) defining a circuit pattern to be projected onto said wafer, (b) including a second layer of material that attenuates the electromagnetic radiation passed therethrough, and which appears substantially transparent to the alignment light, and (c) serving to effect a phase-shift to said electromagnetic radiation passed therethrough.

10. A method according to claim 9, wherein the electromagnetic radiation projected onto the semiconductor through the mask is light in the deep UV range.

11. A method according to claim 10, wherein the alignment light comprises visible light.

12. A method according to claim 9, wherein the alignment light comprises visible light.

13. A method according to claim 11, wherein the alignment light is visible laser light.

14. A method according to claim 11, wherein the alignment light is visible light produced by an Hg lamp.

15. A method according to claim 13, wherein a position of the reticle alignment mark is sensed from said alignment light being absorbed by said mark.

16. A method according to claim 14, wherein position of the reticle alignment mark is sensed from said alignment light being reflected by said mark.

\* \* \* \* \*